US006621427B2

(12) United States Patent
Greenstreet

(10) Patent No.: US 6,621,427 B2
(45) Date of Patent: Sep. 16, 2003

(54) METHOD AND APPARATUS FOR IMPLEMENTING A DOUBLY BALANCED CODE

(75) Inventor: Mark R. Greenstreet, Vancouver (CA)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/156,160

(22) Filed: May 28, 2002

(65) Prior Publication Data

US 2003/0071745 A1 Apr. 17, 2003

Related U.S. Application Data

(60) Provisional application No. 60/328,546, filed on Oct. 11, 2001.

(51) Int. Cl.[7] .................................................. H03M 5/00
(52) U.S. Cl. ............................................ 341/58; 341/50
(58) Field of Search ....................................... 341/50, 58

(56) References Cited

U.S. PATENT DOCUMENTS 6,241,778 B1 * 6/2001 de Lind van Wijngaarden et al. ............................ 341/58
6,489,900 B2 * 12/2002 Shin et al. ..................... 341/50

* cited by examiner

Primary Examiner—Brian Young
Assistant Examiner—Khai Nguyen
(74) Attorney, Agent, or Firm—Park, Vaughan & Fleming LLP

(57) ABSTRACT

One embodiment of the present invention provides a system for encoding a dataword into a current codeword within a stream of codewords, wherein each codeword in the stream has a substantially equal number of ones and zeros, and wherein each transition between codewords involves a substantially equal number of rising and falling transitions. The system creates the current codeword from the dataword and a preceding codeword in the stream by inverting substantially half of the zero bits of the preceding codeword and inverting substantially half of the one bits of the preceding codeword. This is accomplished by using the dataword to select one bits and the zero bits to invert; determining locations of the one bits and zero bits in the preceding codeword; and then inverting the selected one bits and zero bits in the preceding codeword to form the current codeword. Note that because the present invention balances rising and falling transitions without significantly increasing pin requirements, it achieves most of the electrical advantages of differential signaling along with most of the pin-efficiency of single-ended signaling. Moreover, by having substantially half the bits change at each transition, it is possible to determine timing information from transitions in the codeword, without the need for a separate clock signal.

24 Claims, 4 Drawing Sheets

METHOD AND APPARATUS FOR IMPLEMENTING A DOUBLY BALANCED CODE

RELATED APPLICATION

This application hereby claims priority under 35 U.S.C. §119 to U.S. Provisional Patent Application No. 60/328,546 by inventor Mark R. Greenstreet, filed on Oct. 11, 2001.

BACKGROUND

1. Field of the Invention

The present invention relates to techniques for transmitting data through electrical signals. More specifically, the present invention relates to a method and an apparatus for implementing a doubly balanced code, wherein each codeword has a substantially equal number of ones and zeros, and wherein each transition between codewords involves a substantially equal number of rising and falling transitions.

2. Related Art

As processor clock speeds continue to increase at an exponential rate, data must be transferred at correspondingly faster rates between computer system components. Computer systems typically use large parallel busses for this purpose.

These large parallel busses typically use either single-ended signaling or differential signaling. Single-ended signaling makes use of a single signal line to carry each bit, along with one or more clock lines to latch the signals.

In contrast, differential signaling uses two signal lines to carry each bit, wherein the value of the bit is indicated by a voltage difference between the two signal lines. Because currents are balanced between power and ground rails, differential signaling reduces power supply noise and solves the problem of where return currents come from. Moreover, differential signaling is less sensitive to ground shifts between sender and receiver because differential signaling relies on voltage differences between pairs of signal lines, instead of relying on an absolute voltage level of a single signal line.

Unfortunately, differential signaling uses twice as many wires as single-ended signaling, which can greatly exacerbate pin limitation problems.

What is needed is a method and apparatus for transferring data between computer system components without the large number of signal lines required by differential signaling, and without the current balance and ground noise problems of single-ended signaling.

SUMMARY

One embodiment of the present invention provides a system for encoding a dataword into a current codeword within a stream of codewords, wherein each codeword in the stream has a substantially equal number of ones and zeros, and wherein each transition between codewords involves a substantially equal number of rising and falling transitions. The system creates the current codeword from the dataword and a preceding codeword in the stream by inverting substantially half of the zero bits of the preceding codeword and inverting substantially half of the one bits of the preceding codeword. This is accomplished by using the dataword to select one bits and the zero bits to invert; determining locations of the one bits and zero bits in the preceding codeword; and then inverting the selected one bits and zero bits in the preceding codeword to form the current codeword. Note that because the present invention balances rising and falling transitions without significantly increasing pin requirements, it achieves most of the electrical advantages of differential signaling along with most of the pin-efficiency of single-ended signaling. Moreover, by having substantially half the bits change at each transition, it is possible to determine timing information from transitions in the codeword, without the need for a separate clock signal.

In a variation on this embodiment, there exists a predefined mapping between possible bit patterns for the dataword and corresponding inversion patterns for zero bits in the preceding codeword. There also exists a predefined mapping between possible bit patterns for the dataword and corresponding inversion patterns for one bits in the preceding codeword.

In a variation on this embodiment, the system divides the dataword into a first index and a second index. The system uses the first index to identify zero bits of the preceding codeword to invert, and uses the second index to identify one bits of the preceding codeword to invert.

In a variation on this embodiment, using the first index to identify zero bits of the preceding codeword to invert involves using the first index to perform a lookup into a first table containing inversion patterns for zero bits of the preceding Moreover, using the second index to identify one bits of the preceding codeword to invert involves using the second index to perform a lookup into a second table containing inversion patterns for one bits of the preceding codeword.

In a variation on this embodiment, determining locations of the one bits and zero bits in the preceding codeword involves using a prefix sum calculation circuit to identify locations of zero bits and one bits in the preceding codeword.

In a variation on this embodiment, inverting the selected one bits and zero bits in the preceding codeword involves using a selection circuit for each bit in the preceding codeword to select a corresponding inversion bit based on an index for the bit generated by the prefix sum calculation circuit.

One embodiment of the present invention provides a system for decoding a codeword into a data word. During operation, the system receives a stream of codewords, including a preceding codeword and the current codeword, wherein each codeword in the stream has a substantially equal number of ones and zeros, and wherein each transition between codewords involves a substantially equal number of rising and falling transitions. Next, the system identifies a pattern of bits that have been inverted in the preceding codeword to produce the current codeword, and translates this pattern into the data word, wherein the translation uses a predefined mapping between inversion patterns for bits in the preceding codeword and bit patterns for the data word.

In a variation on this embodiment, the system identifies a pattern of zero bits that have been inverted in the preceding codeword to produce the current codeword, and also identifies a pattern of one bits that have been inverted in the preceding codeword to produce the current codeword. In this embodiment, the system translates the pattern of zero bits into a first part of the data word by using a predefined mapping between inversion patterns for zero bits in the preceding codeword and bit patterns for the first part of the data word. The system also translates the pattern of one bits into a second part of the data word by using a predefined mapping between inversion patterns for one bits in the preceding codeword and bit patterns for the second part of the data word.

In a variation on this embodiment, the system identifies the pattern of one bits and the pattern of zero bits by producing a permutation that sorts the preceding codeword so that: zeros and ones are separated; relative ordering is maintained between ones; and relative ordering is maintained between zeros. Next, the system permutes the current codeword using the permutation, so that a first part of the permuted codeword contains the pattern of zero bits in the preceding codeword have been inverted, and a second part of the permuted codeword contains the pattern of one bits in the preceding codeword have been inverted. In a variation on this embodiment, this permutation is produced by using a sorting network.

In a variation on this embodiment, the system uses the pattern of zero bits to perform a lookup into a first table containing corresponding bit patterns for the first part of the data word. The system also uses the pattern of one bits to perform a lookup into a second table containing corresponding bit patterns for the second part of the data word.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Transmitter and Receiver

Figure 1:
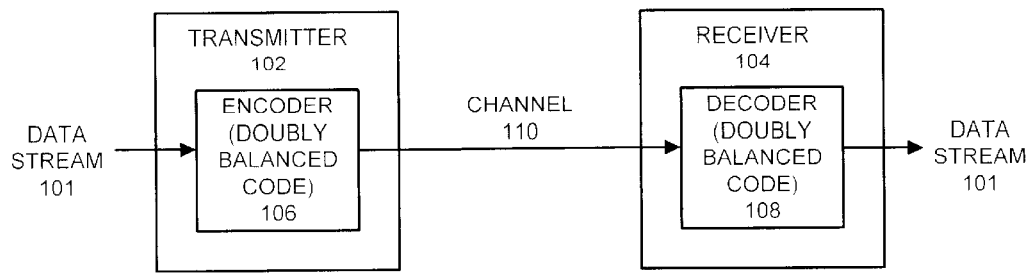
FIG. 1 illustrates a transmitter and a receiver for a doubly balanced code in accordance with an embodiment of the present invention.

FIG. 1 illustrates a transmitter 102 and a receiver 104 for a doubly balanced code in accordance with an embodiment of the present invention. Transmitter 102 receives a data stream 101 comprised of a sequence of datawords. Transmitter 102 encodes these datawords through encoder 106 to produce a corresponding stream of codewords that feeds across channel 110 to receiver 104.

Receiver 104 decodes the stream of codewords through decoder 108 to restore data stream 101. Note that encoder 106 and decoder 108 implement a doubly balanced code, wherein each codeword has a substantially equal number of ones and zeros, and wherein the number of rising transitions is substantially equal for each transition, and the number of falling transitions is substantially equal for each transition. Moreover, for each transition, the number of rising transitions and the number of falling transitions are substantially equal.

Also note that the present invention can generally be applied to any context in which a plurality of signal lines are used to transfer data. In one embodiment, transmitter 102 and receiver 104 are located on different components of a digital system, such as a computer system. In another embodiment, transmitter 102 and receiver 104 are located on different computer systems.

Decoder

Figure 2:
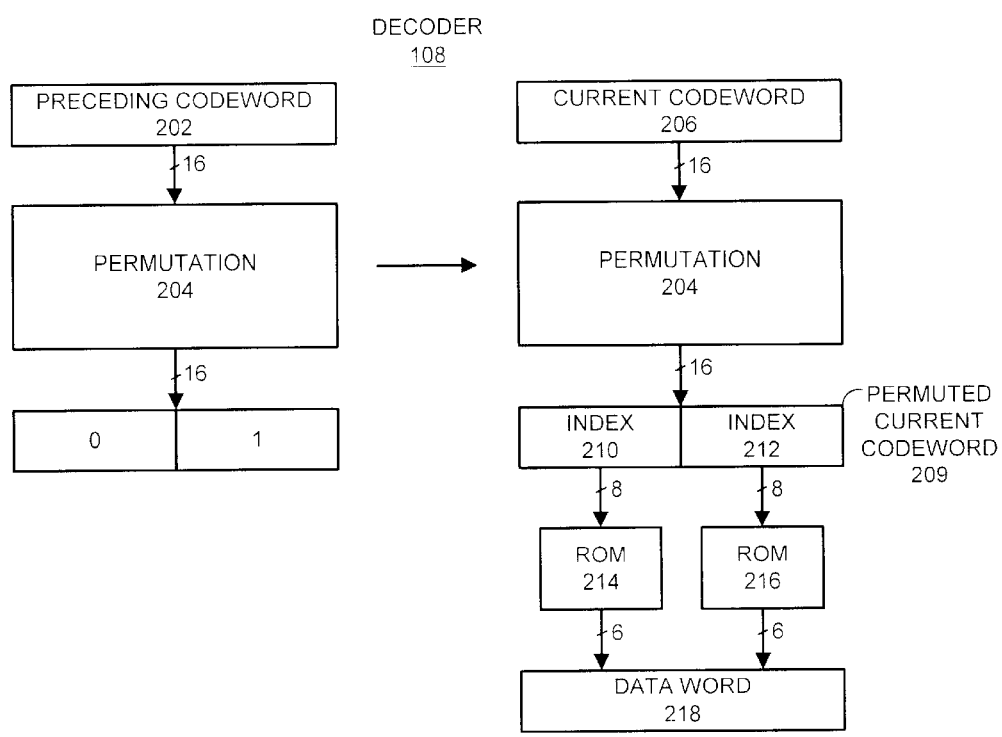
FIG. 2 illustrates the structure of a decoder for a doubly balanced code in accordance with an embodiment of the present invention.

FIG. 2 illustrates the structure of a decoder 108 for a doubly balanced code in accordance with an embodiment of the present invention. Referring to the left-hand side of FIG. 2, decoder 108 operates by first producing a permutation 204 that permutes a preceding codeword 202 so that: (1) zeros and ones are separated; (2) relative ordering is maintained between ones; and (3) relative ordering is maintained between zeros. Note that permutation 204 can be generated using a stable storing network.

Next, a current codeword 206 is permuted using permutation 204 to produce permuted current codeword 209. The left half of permuted current codeword 209 forms an index 210 containing a pattern of zero bits substantially half of which have been inverted in preceding codeword 202 to produce the current codeword 206. Similarly, the right half of permuted current codeword 209 forms an index 212 containing a pattern of zero bits substantially half of which have been inverted in preceding codeword 202 to produce current codeword 206.

Index 210 is used to lookup a corresponding pattern of dataword bits from read-only memory (ROM) 214. At the same time, index 212 is used to lookup a corresponding pattern of dataword bits from ROM 216. The dataword bits from ROM 214 and ROM 216 are concatenated together to produce dataword 218.

Assume that preceding codeword 202 is n bits in size. This implies index 210 and index 212 are each n/2 bits in size. If half of the zero bits associated with index 210 are inverted, there are $$\binom{n/2}{n/4}$$

possible patterns of bit inversions for index 210. This can be translated into $$\left\lfloor \log_2 \binom{n/2}{n/4} \right\rfloor$$

bits of dataword 218. Some embodiments may transmit more information than this because fractional bits from adjacent codewords can be aggregated to transmit additional information.

For example, if n=16 bits, there are $$\binom{8}{4} = 70$$

possible patterns of bit inversions for index 210. Likewise, there are 70 possible patterns of bit inversions for index 212. This yields 70*70=4900 codewords. Note that 4096 codewords are sufficient to transmit 12 bits (i.e. $2^{12}$=4096). Thus, each codeword can convey 12 bits of information. Hence, current codeword 206, which is 16 bits in size, can be translated into dataword 218, which is 12 bits in size. Moreover, there also remain 4900−4096=804 "out-of-band" symbols that can be used to for other purposes, such as flow control or to support specific protocols.

Note that ROM 214 can store any possible mapping from the pattern of bit inversions contained in index 210 to possible bit patterns for the first half of dataword 218, so long as a corresponding encoder uses the same mapping. Similarly, ROM 216 can store any possible mapping from the pattern of bit inversions contained in index 212 to possible bit patterns for the second half of dataword 218, so long as a corresponding encoder uses the same mapping.

Encoder

Figure 3:
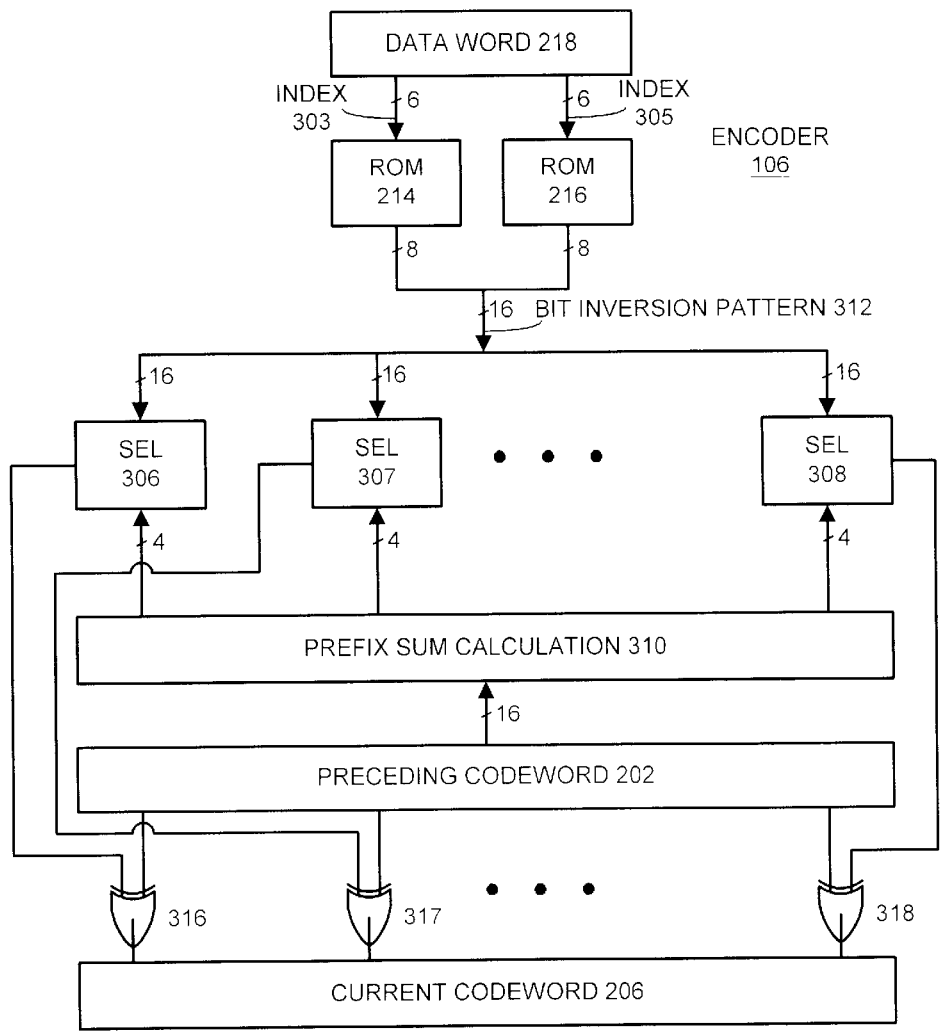
FIG. 3 illustrates the structure of an encoder for a doubly balanced code in accordance with an embodiment of the present invention.

FIG. 3 illustrates the structure of an encoder 106 for a doubly balanced code in accordance with an embodiment of the present invention. Encoder 106 receives a dataword 218. A first half of dataword 218 forms an index 303 that feeds into ROM 302 to produce a pattern of bit inversions for the zero bits of the preceding codeword 202. Similarly, a second half of dataword 218 forms an index 305 that feeds into ROM 304 to produce a pattern of bit inversions for the one bits of the preceding codeword 202.

At the same time, preceding codeword 202 feeds into prefix sum calculation circuit 310 to produce identification lines for each bit of preceding codeword 202. These identification lines indicate whether the bit is a one or a zero, and additionally specify ordering information. For example, an index for the fourth bit of preceding codeword 202 can indicate that the fourth bit is a one, and furthermore that the fourth bit is the third one from left to right in preceding codeword 202.

The identification lines for a given bit of preceding codeword 202 feed into an associated selector circuit 306, such as a multiplexer, that selects a matching bit inversion signal from the outputs of ROMs 302 and 304. This bit inversion signal feeds into an exclusive-OR gate 316 that inverts the bit of preceding codeword 202, if necessary, to produce a corresponding bit of current codeword 206.

Note that the bus widths indicated in FIGS. 2 and 3 are specified for purposes of illustration only. Other embodiments may use other codeword sizes and therefore other widths for intermediate quantities.

Process of Encoding

Figure 4:
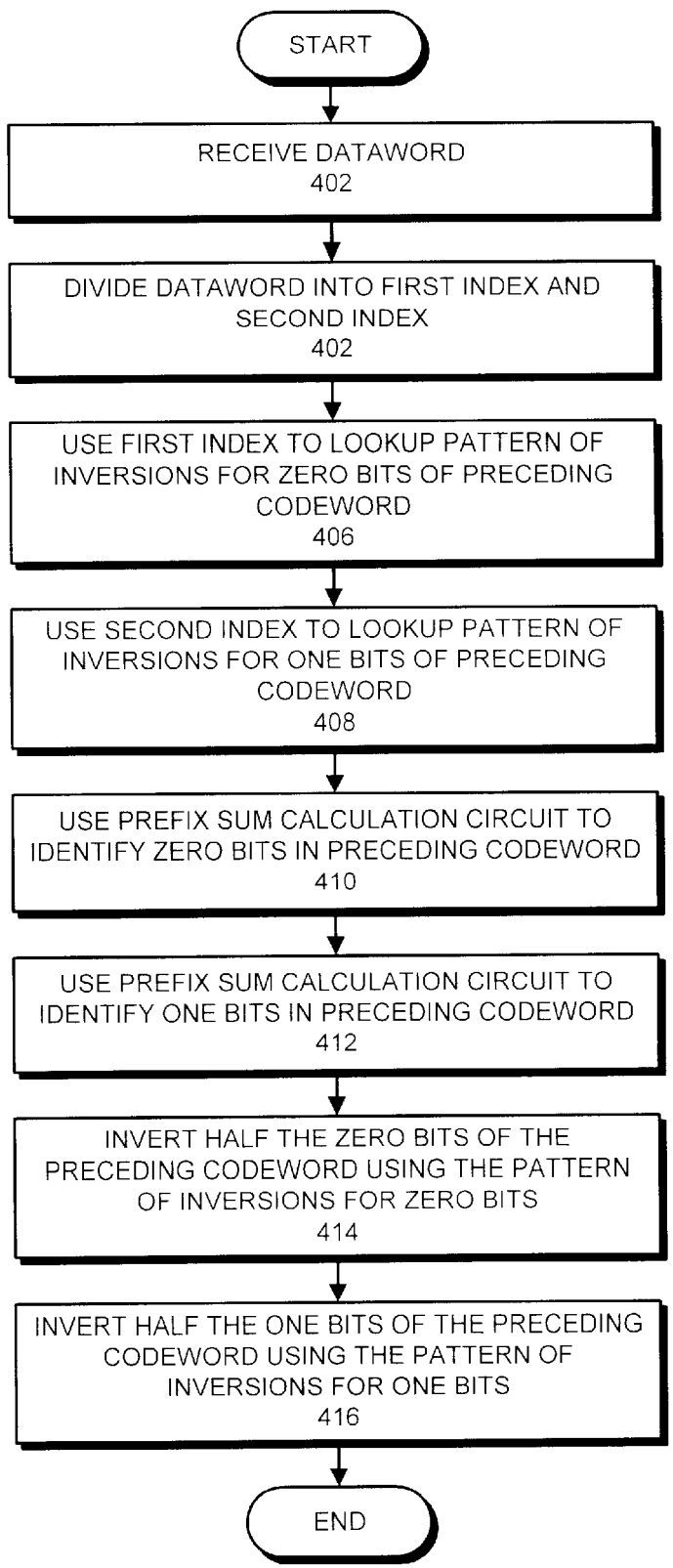
FIG. 4 is a flow chart illustrating the encoding process in accordance with an embodiment of the present invention.

FIG. 4 is a flow chart illustrating the encoding process in accordance with an embodiment of the present invention. The system starts by receiving a dataword 218 (step 402), which is divided into an index 303 and an index 305 (step 404). Next, index 303 is used to lookup or otherwise calculate a pattern of inversions for zero bits of preceding codeword 202 (step 406). At the same time, index 305 is used to lookup or otherwise calculate a pattern of inversions for one bits of preceding codeword 202 (step 408). The pattern of inversions for zero bits from step 406 and the pattern of inversions for one bits from step 408 form a bit inversion pattern 312.

As bit inversion pattern 312 is being computed, preceding codeword 202 also feeds through prefix sum calculation circuit 310 to produce an identifier for each bit in preceding codeword 202. This involves identifying zero bits (step 410), as well as identifying one bits (step 412).

Next, the system uses each identifier to select an inversion bit from bit inversion pattern 312. This inversion bit is used to selectively invert the corresponding bit of preceding codeword 202 to produce current codeword 206. This process inverts half of the zero bits of preceding codeword 202 using the pattern of zero bit inversions from step 406 (step 414). It also inverts half of the one bits of preceding codeword 202 using the pattern of one bit inversions from step 408 (step 416).

Process of Decoding

Figure 5:
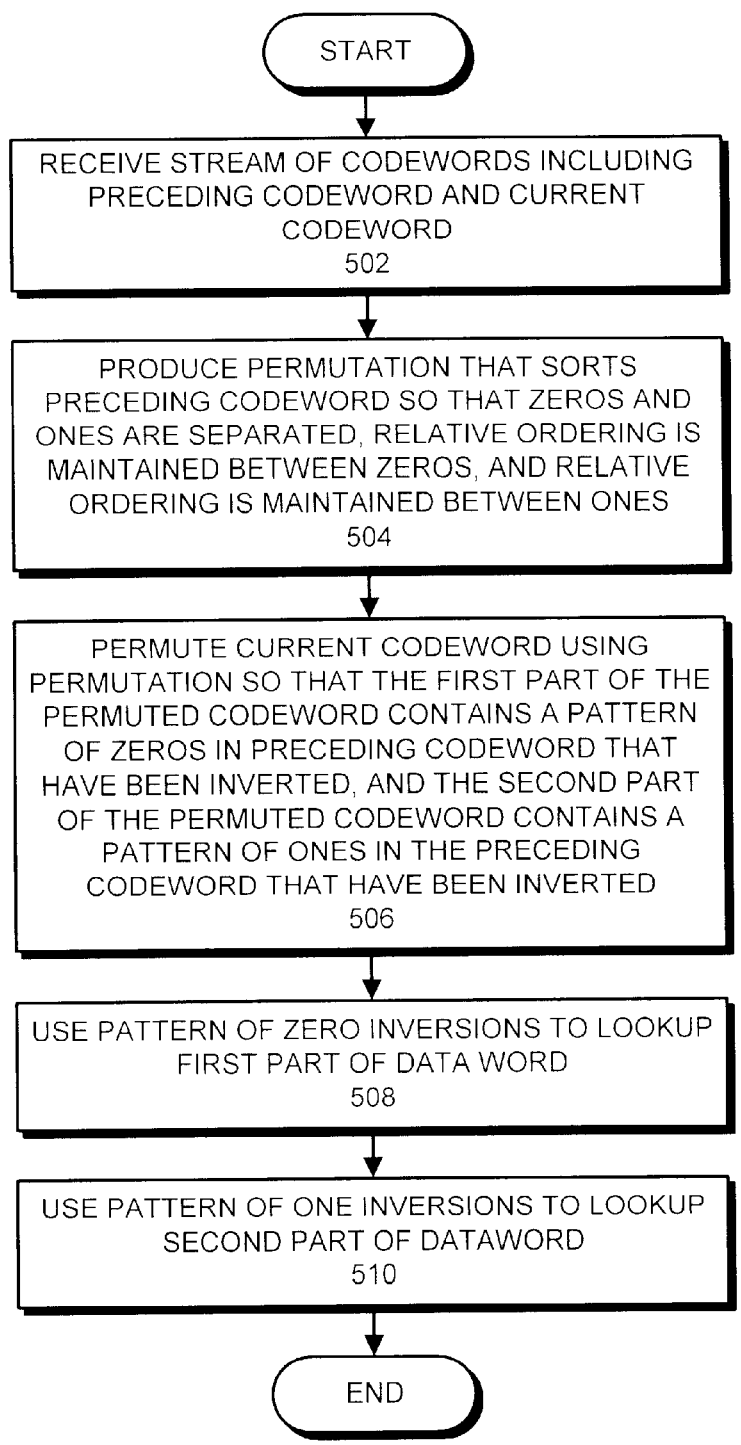
FIG. 5 is a flow chart illustrating the decoding process in accordance with an embodiment of the present invention.

FIG. 5 is a flow chart illustrating the decoding process in accordance with an embodiment of the present invention. During operation, the system receives a stream of codewords, including a preceding codeword 202 and a current codeword 206 (step 502). Next, the system uses preceding codeword 202 to produce a permutation 204 that sorts preceding codeword 202 so that: (1) zeros and ones are separated; (2) relative ordering is maintained between ones; and (3) relative ordering is maintained between zeros (step 504).

The system then permutes current codeword 206 using permutation 204 so that the first part of the permuted current codeword 209 forms an index 210 that contains a pattern of zeros in preceding codeword 202 that have been inverted to produce current codeword 206. Moreover, the second part of the permuted current codeword 209 forms an index 212 that contains a pattern of ones in preceding codeword 202 that have been inverted to produce current codeword 206 (step 506).

Next, the system uses the pattern of zero bit inversions in index 210 to lookup or otherwise calculate a first part of dataword 218 (step 508). At the same time, the system uses the pattern of one bit inversions in index 212 to lookup or otherwise calculate a second part of dataword 218 (step 510). Note that if a lookup is performed using ROMs 214 and 216, the mapping contained in ROM 214 is the inverse of the mapping contained in ROM 302 from FIG. 3. Similarly, the mapping contained in ROM 216 is the inverse of the mapping contained in ROM 304.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for encoding a dataword into a current codeword in a stream of codewords, wherein each codeword in the stream has a substantially equal number of ones and zeros, and wherein each transition between codewords involves a substantially equal number of rising and falling transitions, the method comprising:

receiving the dataword; and creating the current codeword from the dataword and a preceding codeword in the stream by inverting substantially half of the zero bits of the preceding codeword and inverting substantially half of the one bits of the preceding codeword;

wherein inverting substantially half of the zero bits and substantially half of the one bits involves, using the dataword to select one bits and the zero bits to invert, determining locations of the one bits and zero bits in the preceding codeword, and inverting the selected one bits and zero bits in the preceding codeword to form the current codeword.

2. The method of claim 1, wherein there exists a predefined mapping between possible bit patterns for the dataword and corresponding inversion patterns for zero bits in the preceding codeword; and wherein there exists a predefined mapping between possible bit patterns for the dataword and corresponding inversion patterns for one bits in the preceding codeword.

3. The method of claim 1, wherein the method further comprises:
  dividing the dataword into a first index and a second index;
  wherein selecting zero bits to invert involves using the first index to identify zero bits of the preceding codeword to invert; and
  wherein selecting one bits to invert involves using the second index to identify one bits of the preceding codeword to invert.

4. The method of claim 3,
  wherein using the first index to identify zero bits of the preceding codeword to invert involves using the first index to calculate an inversion pattern for zero bits of the preceding codeword; and
  wherein using the second index to identify one bits of the preceding codeword to invert involves using the second index to calculate an inversion pattern for one bits of the preceding codeword.

5. The method of claim 4,
  wherein using the first index to calculate an inversion pattern for zero bits of the preceding codeword involves using the first index to perform a lookup into a first table containing inversion patterns for zero bits of the preceding codeword; and
  wherein using the second index to calculate an inversion pattern for one bits of the preceding codeword involves using the second index to perform a lookup into a second table containing inversion patterns for one bits of the preceding codeword.

6. The method of claim 1, wherein determining locations of the one bits and zero bits in the preceding codeword involves using a prefix sum calculation circuit to identify locations of zero bits and one bits in the preceding codeword.

7. The method of claim 6, wherein inverting the selected one bits and zero bits in the preceding codeword involves using a selection circuit for each bit in the preceding codeword to select a corresponding inversion bit based on an index for the bit generated by the prefix sum calculation circuit.

8. An apparatus that encodes a dataword into a current codeword in a stream of codewords, wherein each codeword in the stream has a substantially equal number of ones and zeros, and wherein each transition between codewords involves a substantially equal number of rising and falling transitions, the method comprising:
  an input that is configured to receive the dataword and a preceding codeword in the stream of codewords; and
  an inverting circuit that is configured to create the current codeword from the dataword and the preceding codeword inverting substantially half of the zero bits of the preceding codeword and inverting substantially half of the one bits of the preceding codeword;
  wherein the inverting circuit is configured to,
    use the dataword to select one bits and the zero bits to invert,
    determine locations of the one bits and zero bits in the preceding codeword, and to
    invert the selected one bits and zero bits in the preceding codeword to form the current codeword.

9. The apparatus of claim 8,
  wherein there exists a predefined mapping between possible bit patterns for the dataword and corresponding inversion patterns for zero bits in the preceding codeword; and
  wherein there exists a predefined mapping between possible bit patterns for the dataword and corresponding inversion patterns for one bits in the preceding codeword.

10. The apparatus of claim 8, wherein the inverting circuit includes
  a partitioning mechanism that is configured to partition the dataword into a first index and a second index;
  wherein the inverting circuit is configured to use the first index to identify zero bits of the preceding codeword to invert; and
  wherein the inverting circuit is configured to use the second index to identify one bits of the preceding codeword to invert.

11. The apparatus of claim 10,
  wherein the inverting circuit is configured to use the first index to calculate an inversion pattern for zero bits of the preceding codeword; and
  wherein the inverting circuit is configured to use the second index to calculate an inversion pattern for one bits of the preceding codeword.

12. The apparatus of claim 11,
  wherein the inverting circuit is configured to calculate the inversion pattern for zero bits by using the first index to perform a lookup into a first table containing inversion patterns for zero bits of the preceding codeword; and
  wherein the inverting circuit is configured to calculate the inversion pattern for one bits by using the second index to perform a lookup into a second table containing inversion patterns for one bits of the preceding codeword.

13. The apparatus of claim 8, wherein the inverting circuit includes a prefix sum calculation circuit that is configured to identify locations of zero bits and one bits in the preceding codeword.

14. The apparatus of claim 13, wherein the inverting circuit includes a selection circuit for each bit in the preceding codeword to select a corresponding inversion bit based on an index for the bit generated by the prefix sum calculation circuit.

15. A method for decoding a current codeword into a dataword, the method comprising:
  receiving a stream of codewords, including a preceding codeword and the current codeword, wherein each codeword in the stream has a substantially equal number of ones and zeros, and wherein each transition between codewords involves a substantially equal number of rising and falling transitions;
  identifying a pattern of bits that have been inverted in the preceding codeword to produce the current codeword; and
  translating the pattern of bits that have been inverted into the dataword, wherein the translation uses a predefined mapping between inversion patterns for bits in the preceding codeword and bit patterns for the dataword.

16. The method of claim 15,
  wherein identifying the pattern of bits that have been inverted involves,
    identifying a pattern of zero bits that have been inverted in the preceding codeword to produce the current codeword, and
    identifying a pattern of one bits that have been inverted in the preceding codeword to produce the current codeword; and
  wherein translating the pattern of bits into the dataword involves, translating the pattern of zero bits into a first part of the dataword, wherein the translation uses a predefined mapping between inversion patterns for zero bits in the preceding codeword and bit patterns for the first part of the dataword, and translating the pattern of one bits into a second part of the dataword, wherein the translation uses a predefined mapping between inversion patterns for one bits in the preceding codeword and bit patterns for the second part of the dataword.

17. The method of claim 16, wherein identifying the pattern of one bits and the pattern of zero bits involves:

producing a permutation that sorts the preceding codeword so that,
zeros and ones are separated,
relative ordering is maintained between ones, and
relative ordering is maintained between zeros; and permuting the current codeword using the permutation to produce a permuted codeword,
wherein a first part of the permuted codeword contains the pattern of zero bits in the preceding codeword have been inverted, and
wherein a second part of the permuted codeword contains the pattern of one bits in the preceding codeword have been inverted.

18. The method of claim 17, wherein producing the permutation involves using a sorting network.

19. The method of claim 16, wherein translating the pattern of zero bits into the first part of the dataword involves using the pattern of zero bits to perform a lookup into a first table containing corresponding bit patterns for the first part of the dataword; and wherein translating the pattern of one bits into the second part of the dataword involves using the pattern of one bits to perform a lookup into a second table containing corresponding bit patterns for the second part of the dataword.

20. An apparatus for decoding a current codeword into a dataword, comprising:

an input that is configured to receive a stream of codewords, including a preceding codeword and the current codeword, wherein each codeword in the stream has a substantially equal number of ones and zeros, and wherein each transition between codewords involves a substantially equal number of rising and falling transitions;

an identification circuit that is configured to identify a pattern of bits that have been inverted in the preceding codeword to produce the current codeword; and a translation circuit that is configured to translate the pattern of bits that have been inverted into the dataword based on a predefined mapping between inversion patterns for bits in the preceding codeword and bit patterns for the dataword.

21. The apparatus of claim 20, wherein the identification circuit is configured to,
identify a pattern of zero bits that have been inverted in the preceding codeword to produce the current codeword, and to
identify a pattern of one bits that have been inverted in the preceding codeword to produce the current codeword; and wherein the translation circuit is configured to,
translate the pattern of zero bits into a first part of the dataword based on a predefined mapping between inversion patterns for zero bits in the preceding codeword and bit patterns for the first part of the dataword, and to
translate the pattern of one bits into a second part of the dataword based on a predefined mapping between inversion patterns for one bits in the preceding codeword and bit patterns for the second part of the dataword.

22. The apparatus of claim 21, wherein the identification circuit includes a permutation circuit;

wherein the permutation circuit is configured to produce a permutation that sorts the preceding codeword so that,
zeros and ones are separated,
relative ordering is maintained between ones, and
relative ordering is maintained between zeros; and wherein the permutation circuit is configured to permute the current codeword using the permutation to produce a permuted codeword,
wherein a first part of the permuted codeword contains the pattern of zero bits in the preceding codeword have been inverted, and
wherein a second part of the permuted codeword contains the pattern of one bits in the preceding codeword have been inverted.

23. The apparatus of claim 22, wherein the permutation circuit includes a sorting network that produces the permutation.

24. The apparatus of claim 21, wherein the translation circuit is configured to use the pattern of zero bits to perform a lookup into a first table containing corresponding bit patterns for the first part of the dataword; and wherein the translation circuit is configured to use the pattern of one bits to perform a lookup into a second table containing corresponding bit patterns for the second part of the dataword.

* * * * *